United States Patent [19]

Takei et al.

[11] 3,996,658
[45] Dec. 14, 1976

[54] PROCESS FOR PRODUCING SEMICONDUCTOR MEMORY DEVICE

[75] Inventors: Akira Takei, Yokohama; Yoshihiko Hika, Tokyo; Ryoiku Togei, Kawasaki, all of Japan

[73] Assignee: Fujitsu Ltd., Kanagawa, Japan

[22] Filed: Mar. 30, 1976

[21] Appl. No.: 671,956

[30] Foreign Application Priority Data

Mar. 31, 1975 Japan .............................. 50-38809

[52] U.S. Cl. .................................. 29/571; 29/578; 357/24
[51] Int. Cl.² ......................................... B01J 17/00
[58] Field of Search ................ 29/571, 578; 357/24

[56] References Cited
UNITED STATES PATENTS

| | | | |
|---|---|---|---|
| 3,752,711 | 8/1973 | Kooi | 29/571 |
| 3,852,104 | 12/1974 | Kooi | 29/571 |
| 3,899,372 | 8/1975 | Esch | 29/571 |
| 3,936,331 | 2/1976 | Luce | 29/571 |

Primary Examiner—W. Tupman
Attorney, Agent, or Firm—Staas & Halsey

[57] ABSTRACT

A distance between two electrodes of a CCD device is reduced to an extremely small value, thereby increasing the memory density, of the CCD device. In the process of the present invention, upon formation of a first electrode, an insulating layer is formed on the entire top surface of the semiconductor wafer. The material of another electrode is then placed on the entire top surface of the wafer. These layers are then selectively removed to form a CCD structure.

16 Claims, 10 Drawing Figures

PROCESS FOR PRODUCING SEMICONDUCTOR MEMORY DEVICE

BACKGROUND OF THE INVENTION

1. Field of the Invention

The present invention relates to a process for producing a semiconductor memory device, and, more particularly to a semiconductor memory device employing the structure of a charge coupled device, hereinafter referred to as a CCD.

2. DESCRIPTION OF THE PRIOR ART

Recently, attention has been concentrated upon employing CCD's to memory devices.

In the general structure of CCD, for example a three phase CCD, one gate electrode and a plurality of three electrode sets for transferring electric charges are successively arranged on the top surface of an insulating material, which covers the semiconductor material substrate. The electrodes of the CCD, usually produced by a photolithographic process, are separated by equidistances, preferably of from 2 to 3 microns. That is, the material for the elctrodes, such as aluminum, is placed on the insulating material and then is covered by a photo-resistant layer. A photolithographic pattern is then drawn on the photo-resistant layer so as to allow selective removal of this layer and the aluminum from the substrate. Due to the selective removal of the aluminum, individual aluminum electrodes are produced. Since the distance between two electrodes is dependent upon the accuracy of the photolithographic technique, the memory density of the CCD is limited thereto.

SUMMARY OF THE INVENTION

The present invention is generally directed to a process for producing a semiconductor memory device, which comprises a semiconductor material substrate having one particular conductivity type and having on the surface thereof a diffused layer portion having the opposite conductivity type, a first surface region of the substrate adjoining the diffused layer being used as a gate region, and another surface region, adjoining the first surface region, being used as a memory cell region;

a first insulating layer placed on the substrate over the memory cell region and carrying an electrode for the memory cell;

a second insulating layer placed on the substrate over the gate region, being in contact with the first insulating layer and carrying an electrode for the gate. An electric charge of the opposite conductivity type is either injected from the diode semiconductor material substrate and the diffused layer therein, through the gate region into the memory cell region or transferred from the memory cell region through the gate region to the diode. The direction of transfer depends upon the electrical potential level in the substrate and this level is established by an electric field applied by each said electrode through each respective insulating layer. The diode, as described above, is used not only for the detection of the output voltage but also for the injection of the electric charge.

A memory cell device employing, for example, a P-type semiconductor substrate is operated as follows. The memory cell and diode are maintained at different, positive electric potentials in a normal state. At the instant of writing an information 0 into the memory cell, a pulse voltage of positive value is applied to the diode, while applying the positive pulse voltage to the gate. Information 1 can be written in the memory cell by applying a pulse voltage of zero value to both the diode and gate electrodes. The above WRITE state is performed on the presumption that information 1 is storing electrons in the memory cell. At the instant of reading the stored information, the electric potential of the memory cell drops to zero, while the positive pulse voltage is applied to the gate electrode, and the voltage change in the diode is detected. Since the memory cell has positive electric potential during the storage of the information, the minority carriers are generated in the memory cell with the result that the 0 state is changed to the 1 state. Accordingly, the memory cell must be periodically refreshed by means of dropping the potential of the memory electrode to zero.

It is an object of the present invention to provide a process for producing a CCD semiconductor memory device in which the memory density is increased.

It is another object of the present invention to provide a process in which any layer is used as a mask for a part of the previously formed, underlying layer and the remaining unmask part, of this underlying layer, is etched, by an etchant which does not dissolve the masking layer, thereby decreasing the number of photolithographic processes.

It is a further object of the present invention to provide a process in which the gate electrode and window, for diffusing an impurity into the substrate and for producing the diode, are produced by self-alignment.

It is still another object of the present invention to provide a process in which the number of diffusion steps are decreased.

It is still a further object of the present invention, in which MOS devices associated with the circuitry of CCD are formed on the same substrate with the CCD.

According to the present invention, a first insulating layer, usually, although not necessarily, an oxide layer of $SiO_2$ or nitride layer of $Si_3N_4$, is first formed on a portion of a monocrystalline semiconductor material substrate, which portion is surrounded by a channel stop. The first insulating layer is, in fact, formed on the entire top surface of the substrate. Since a portion of the first insulating layer will remain after the second step so that it masks the memory cell region of the substrate, the first insulating layer must be formed at least over the memory cell region.

Secondly, a material to be used for the electrode of the storing region, usually polycrystalline silicon, is placed over the insulating layer so that it at least covers the memory cell region of the substrate. The electrode material is first placed over the entire surface of the substrate. The polycrystalline silicon is typically deposited by the decomposition of silane at an elevated temperature of approximately 600° C and, further, the polycrystalline silicon is doped with an impurity, which renders the silicon conductive. The electrode material is then selectively removed, thereby exposing a portion of the first insulating layer which covers a region of the substrate in which the gate region and an output diode will be formed. The thickness of the first insulating layer depends on the capacity of the memory cell and can be from 0.03 to 0.15 microns when $SiO_2$ is used. The polycrystalline silicon must be doped with an impurity, typically boron or phosphorous, which renders the polycrystalline silicon conductive; while a thin oxide layer is in fact formed, during the doping, on the exposed part of the first insulating layer. The first insulating layer must therefore be thick enough to prevent impurities from entering the underlying substrate. The exposed first insulating layer must be removed so as to expose a part of the substrate and to form an almost vertical step, formed by the borders of the first underlying insulating layer and the overlying polycrystalline silicon layer of the electrode. The borders extend almost vertically from the surface of the substrate.

When $Si_3N_4$ and polycrystalline silicon are employed, for example, as the insulating and electrode materials, respectively, it is preferable to use the electrode layer as a mask for etching the exposed insulating layer by using an etchant such as a solution of $H_3PO_4$, which is capable of dissolving the $Si_3N_4$ but not the polycrystalline silicon.

Hereinafter, the semiconductor material and all layers formed thereon will be collectively referred to as a wafer.

Thirdly, upon completion of the removal of the first insulating layer, a second insulating layer is formed over the entire top surface of the wafer including the above-mentioned borders to a thickness from 1000 to 1500 angstroms. The second insulating layer may be made of a material which is the same as or different from that of the first insulating layer. The previously mentioned electric field is applied across the second insulating layer and the underlying substrate. The second insulating layer protects the underlying electrode of the memory cell from mechanical damage. The second insulating layer may be either thermally grown or vapour deposited.

Fourthly, a material to be used for the electrode of the gate region, usually polycrystalline silicon, is placed over the second insulating layer so that it covers the gate region. The material can be selectively placed so that it covers at least a part of the memory cell region in addition to the gate region. This selective placing is performed in the same manner as is stated above regarding the electrode of the memory cell. In the selective placing by this step, the second insulating layer is exposed over a region where a diode will be formed on the final step.

Finally, the exposed, second insulating layer is removed so as to expose a part of the substrate. It is preferable to use the gate electrode as a mask and to remove the unmasked, second insulating layer with an etchant that dissolves the insulating layer but does not for dissolving the gate electrode. The wafer is then subjected to a diffusion process where an impurity of a different conductivity type from the substrate is diffused into the exposed substrate. When a polycrystalline silicon is employed for the electrode, the gate above mentioned impurity is simultaneously diffused into the polycrystalline silicon.

The present invention can have the following aspects.

In the first aspect of the present invention, the first insulating layer may be removed to mask only the memory cell region of the substrate. The second step can then be carried out as stated previously, except that the diffusion into the material of the electrode is omitted.

In the second aspect of the present invention, the second insulating layer may be removed during the third step so as to mask only the gate region of the substrate, the borders of both the first insulating layer and the memory cell electrode, and a part of the top surface of the memory cell adjacent to said borders. The formation of the second insulating layer is usually performed by selective thermal oxidation.

Since the selective removal is carried out according to the second aspect of the invention, a portion of the surface of the substrate, in which the diode is to be formed, is exposed.

The thermal oxidation takes place on the exposed substrate simultaneously with the doping of the polycrystalline silicon of the memory cell electrode and the gate electrode, when the exposed substrate is diffused with an impurity.

Ion-implantation is known in the prior art as an alternative to the diffusion method for introducing an impurity into the substrate.

BRIEF DESCRIPTION OF THE DRAWINGS

The invention is further described in detail in the several embodiments illustrated in the accompanying drawings.

DETAILED DESCRIPTION OF THE PREFERRED EMBODIMENT

Figure 1:
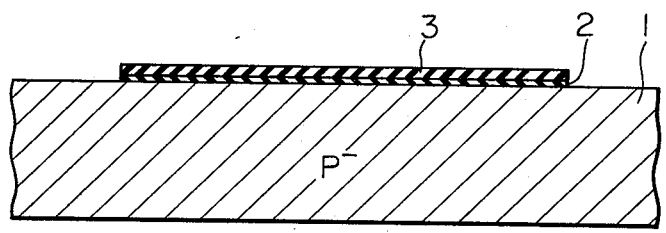
FIGS. 1 through 3 illustrate the conventional process referred to as "Planox", by which a number of regions for circuit elements of a CCD are separated from each other.

The starting point in the process of the present invention is at the substrate of monocrystalline semiconductor material 1. The preferred embodiment, of the substrate material, is silicon. However, it should be noted that any semiconductor material adapted for conducting electrical charges in a CCD can be used in the present invention. It should also be noted that the drawings are schematically drawn to illustrate the principals of the present invention.

The substrate 1 possesses a conductivity of a P-type and an impurity concentration usually of about $10^{15}$ atoms per cubic $cm^3$. This impurity concentration is relatively lower than the impurity concentrations in the hereinafter illustrated channel stop layers and diode layer, and hence, the substrate is designated in the drawings as a P-type. It should be noted at this point that all elements of the wafer can be of conductivity types opposite from the conductivity types described in the specification.

The substrate 1 can include in its interior a N-type buried layer (not shown), in which the electric charge of the CCD is stored. The buried layer usually contains an impurity concentration of $2 \times 10^{16}$ atoms per cubic centimeter. The formation of the buried layer is usually performed by a method, whereby an impurity is selectively diffused into a monocrystalline semiconductor material. Another semiconductor material is subsequently epitaxially grown on the former semiconductor material, thereby forming the substrate.

A $SiO_2$ layer 2, shown in FIG. 1, is thermally grown on the top surface of substrate 1. It is usually grown to a thickness of approximately 500 angstroms. The $SiO_2$ layer 2 is necessary for reliably depositing the $Si_3N_4$ layer 3 over the substrate 1.

The wafer contains numerous $SiO_2$ and $Si_3N_4$ layers, which are separated from each other by a method well known in the art. A process for producing only one CCD device is described hereinafter. The $Si_3N_4$ layer 3, shown in FIG. 1, masks a region of the substrate, in which the elements of the CCD are to be formed. Usually, the $Si_3N_4$ layer 3 is 1500 angstroms thick.

Figure 2:
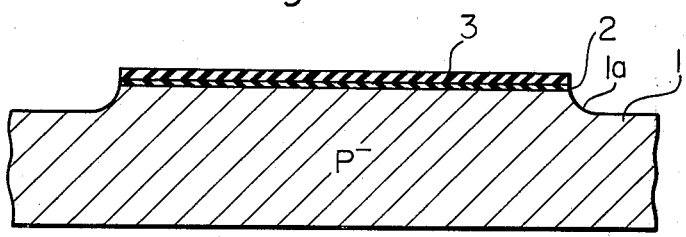
Figure 3:
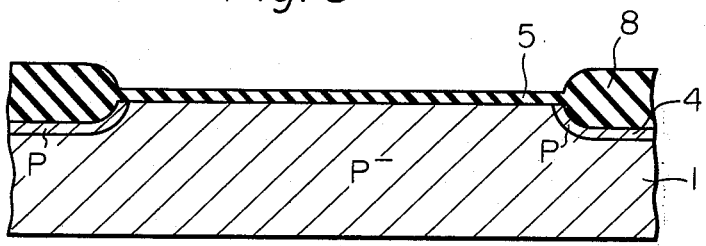

The unmasked region 1a of the substrate 1, shown in FIG. 2, is removed by an etchant, usually a solution of $HNO_3+HF$, to a predetermined depth, thereby forming a groove which extends in a closed path around each CCD device. An impurity such as boron is then diffused into the groove to form a P-type layer 4, shown in FIG. 5, having an impurity concentration usually of $5 \times 10^{16}$ atoms of boron per cubic centimeter. The P-type layer 4 serves as a channel stop. During formation of the P-type channel stop layer 4, a thin oxide layer, usually of 2000 angstroms, is in fact formed on the top surface of the wafer. A thick oxide layer 8 of $SiO_2$ (FIG. 3), which is usually 1 micron thick, is thermally grown over the groove, and thus masks the P-type channel stop layer 4 against removal of any of the layers described hereinafter. The unmasked $Si_3N_4$ layer 3 is removed by an etchant, usually a solution of $H_3PO_4$. After the removal of $Si_3N_4$ layer 3, a thermally grown oxide layer 5 is formed on the exposed region, so as to form a $SiO_2$ layer having a predetermined thickness in the range of 1000 to 1500 angstroms.

A polycrystalline silicon layer 7 (FIG. 4) is selectively placed over a region of the substrate, in which the memory cell is defined by an electrical potential distribution. The polycrystalline silicon will thus serve as an electrode to control the electrical potential distribution of the underlying substrate. The polycrystalline silicon 7 is usually formed to a thickness of, for example, 0.5 microns, caused by the decomposition of silane. An impurity, rendering the polycrystalline silicon conductive, is diffused into the polycrystalline silicon usually by a method whereby a glass layer 6 (FIG. 4) containing, for example, phosphorous is placed on the polycrystalline silicon layer 7 and then the wafer is heated to an elevated temperature, for example, 1050° C. The impurity concentration of the polycrystalline silicon is usually about $10^{19}$ atoms per cubic centimeter, and thus is highly conductive. $SiO_2$ layer 5, which is directly placed on the substrate 1, in fact, increases its thickness during the diffusion.

Figure 4:
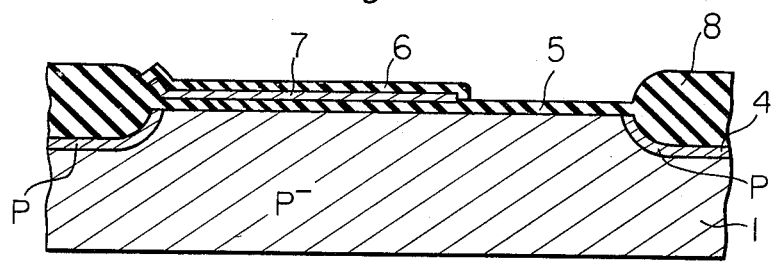
FIGS. 4 through 10 illustrate the process of the present invention, by which the elements of CCD are produced.
Figure 5:
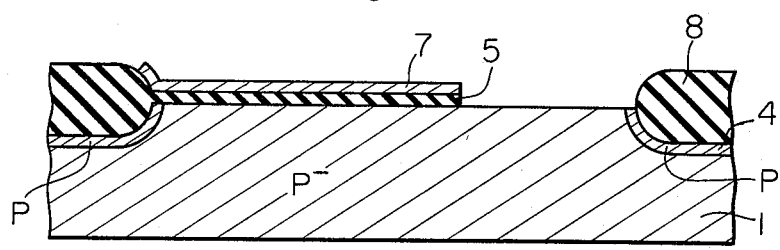

The exposed layers in FIG. 4, i.e., the glass layer 6 and the exposed $SiO_2$ layer 5, are removed, thereby forming a structure as seen in FIG. 5. The removal of the exposed layer 5 is necessary for a thin $SiO_2$ layer having a desired thickness in the range from 1000 to 1500 angstroms to be formed on the top surface of the wafer. The borders of both the $SiO_2$ layer 5 and the polycrystalline silicon layer 7 extend almost vertically upward from the horizontal top surface of the substrate 1.

Figure 6:
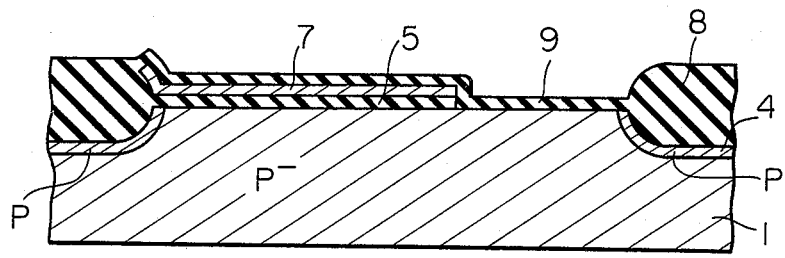

A $SiO_2$ layer 9 of a thickness from 1000 to 1500 angstroms (FIG. 6) is formed on the entire surface of the wafer. This $SiO_2$ layer 9 corresponds to the second insulating layer. The $SiO_2$ layer 9 carries a gate electrode, illustrated hereinafter, which controls the electrical potential in the underlying region of the substrate 1. Since the gate region of the substrate is defined by the electrical potential between the memory cell, which is located below the doped polycrystalline silicon 7, and a diode region, an electric charge is transferred or prevented from being transferred from the memory cell to the diode and vice versa, depending upon the potential generated by the gate electrode. This potential is materially affected by the thickness of the $SiO_2$ layer 9. This thickness may be the same as or different from the thickness of the $SiO_2$ layer 5.

Figure 7:
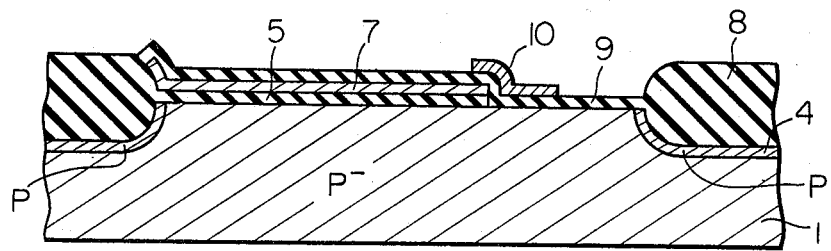
Figure 8:
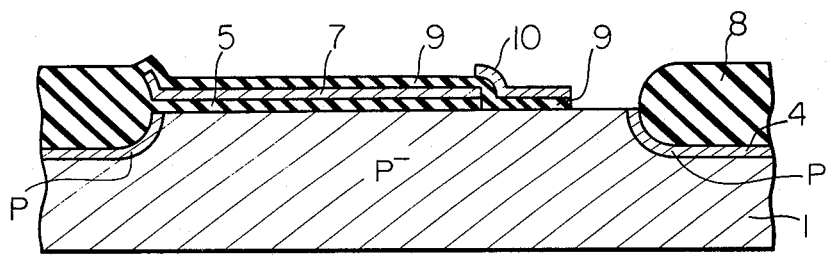

Upon completion of the formation of the $SiO_2$ layer 9, a polycrystalline silicon layer 10 is selectively placed on the $SiO_2$ layer 9, in a manner such that the polycrystalline silicon 10 covers the gate region, and extends over an end part of the doped polycrystalline silicon layer 7 (illustrated at the right side of layer 7). The polycrystalline silicon 10, therefore, is brought into contact with the border of $SiO_2$ layer 9, wherein an altitude difference is formed, and thus the polycrystalline silicon 10 extends both upwardly and horizontally. The selective placing of polycrystalline silicon 10 is performed by etching the polycrystalline silicon layer formed on the entire surface of the wafer either by evaporation or by CVD. In a step illustrated in FIG. 7, the selective placing of polycrystalline silicon is performed, advantageously although not necessarily, in such a manner that a window for diffusing impurity into the substrate is produced in a self-alignment relationship with regard to the polycrystalline silicon. Namely, the polycrystalline silicon 10 and the $SiO_2$ 8 exposes the $SiO_2$ layer 9 over the diode region. This exposed $SiO_2$ layer 9 (FIG. 7) is now removed, usually by etching, while the other exposed layer 9 located above the doped polycrystalline silicon 7 is protected from etching by means of covering the layer 9 and a part of the layer 10 by a photoresist layer. The protection of the doped polycrystalline silicon 7 may, however, not necessarily be performed. In the case of no protection the impurity precipitates in the polycrystalline silicon. Usually, the precipitated impurity does not affect the property of the polycrystalline silicon electrode. The window formed by the removal of the exposed $SiO_2$ layer 9 exposes a part of the substrate 1 (FIG. 8).

Figure 9:
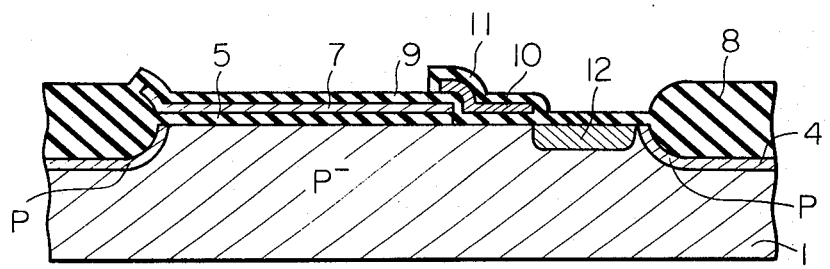
Figure 10:
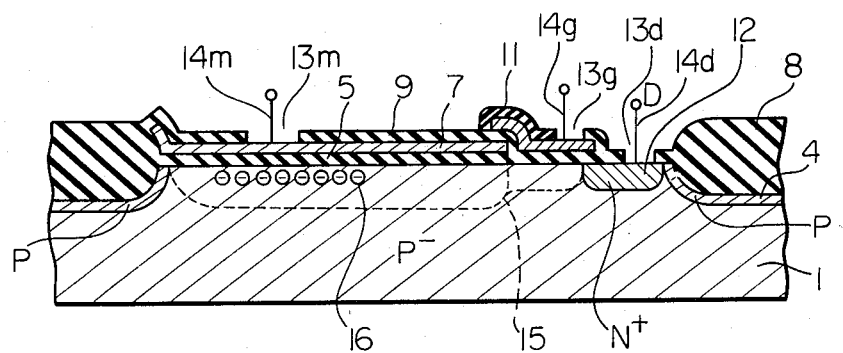

An impurity, such as phosphorous, is simultaneously diffused from the glass layer 11 containing phosphorous into both the exposed substrate 1 and the polycrystalline silicon 10 (FIG. 9). As a result of the diffusion, a N-type region 12 is formed at the surface of substrate 1, and the polycrystalline silicon becomes highly conductive. The impurity concentrations of both the N-type region 12 and the polycrystalline silicon are usually $10^{20}$ atoms per cubic centimeters.

in FIG. 10, windows 13 g (gate) and 13 d (diode) are shown formed in the glass layer 11 to respectively expose doped polycrystalline silicon 10 and N-type region 12. A window 13 m (memory cell) is formed in the $SiO_2$ layer 9 to expose polycrystalline silicon 7. The electrical leads 14 g, d, m are brought into electrical contact with the three exposed members, usually by evaporating aluminum followed by selective etching.

In an alternative embodiment of the invention, MOS transistors are formed on the same body with the CCD devices and are simultaneously formed with the steps for producing the CCD device. In the steps illustrated in FIGS. 1 through 3, the channel stop 4 is formed to surround, in a closed path, a region in which one or more of the MOS transistors are to be formed. The $SiO_2$ layer 5 (FIG. 3) is removed to expose a region of substrate 1, in which an MOS transistor is formed (not shown), preferably simultaneously with the step illustrated in FIG. 5. In the step illustrated in FIG. 6, the $SiO_2$ layer 9 is formed on the exposed substrate of the MOS transistor and serves as a gate insulating layer for the MOS transistor. The thickness of $SiO_2$ layer 9 in CCD is, therefore, equal to that in the MOS transistor. In the step illustrated in FIG. 7, the polycrystalline silicon 10 is selectively placed on the gate region of the MOS transistor and serves as a gate electrode. In the step illustrated in FIG. 8, the $SiO_2$ layer of the MOS transistor is selectively removed to expose both the source and drain regions (not shown) of the substrate 1. Through windows formed by this selective removal, an impurity is diffused into all of the source and drain regions as well as the polycristalline silicon of the MOS transistor. This diffusion is simultaneously performed with the diffusion of the CCD in the step illustrated in FIG. 9.

In still another alternative embodiment of the present invention, $Si_3N_4$ is employed instead of $SiO_2$ for the insulating layer 5, and $SiO_2$, which is in fact formed on the $Si_3N_4$ layer 5 (FIG. 3) during diffusion and oxidation of the channel stops 4, is removed to expose the $Si_3N_4$ layer 5. The wafer is then subjected to the step shown in FIG. 4. The polycrystalline silicon 7 is placed over a part of the $Si_3N_4$ layer 5. The polycrystalline silicon 7, therefore, can serve as a mask, which protects the underlying $Si_3N_4$ against an etchant, typically a solution of $H_3PO$. The unmasked $Si_3N_4$ layer 5 is, therefore, removed and a structure as seen in FIG. 5 is obtained. The wafer is subsequently subjected to the steps illustrated in FIG. 6 through 10.

In a further alternative embodiment of the invention, the polycrystalline silicon 7 (FIG. 4) is not doped and, thus, no glass layer 6 is formed. The wafer is then subjected to the steps illustrated in FIGS. 5 through 7, wherein the insulating layer 9 is $SiO_2$. In the step illustrated in FIG. 8, the top surface of the wafer, which is not masked by the polycrystalline silicon 10, is removed by an etchant, which dissolves $SiO_2$ but not polycrystalline silicon. Accordingly, in the step of FIG. 8, in addition to the substrate, all of the polycrystalline silicon 7 is exposed, except for a part covered by the polycrystalline silicon 10. The polycrystalline silicon 7 is then doped together with the doping of the polycrystalline silicon 10 and the exposed substrate 1.

Although not described in order to avoid unnecessarily complicating this description, it is obvious that the selective placing and etching in the process of the invention are performed by a well-known photolithography technique.

It is to be understood that the semiconductor device can be produced by a combination of several or all of the described embodiments.

What we claim is:

1. A process for producing a semiconductor memory device, which comprises
   a semiconductor material substrate of one particular conductivity type and having on the surface thereof a diffused layer of the opposite conductivity type defining a diode region, a surface region of the substrate adjoining the diffused layer defining a first gate region, and another surface region adjoining said one surface region defining a memory cell region,
   a first insulating layer on said substrate over said memory cell region and carrying an electrode for said memory cell,
   a second insulating layer on said substrate over said first gate region being in contact with said first insulating layer and carrying an electrode for said gate region, wherein
said process comprising steps of:
   forming said first insulating layer over at least said memory cell region of the substrate;
   forming a layer of material to be used for said memory cell electrode, said layer being selectively placed on a part of said first insulating layer so as to mask said first insulating layer over said memory cell region;
   removing the exposed, other part of said first insulating layer so as to expose an unmasked part of the substrate;
   forming said second insulating layer over the top surface of both said exposed unmasked part of the substrate and said layer of material to be used for the memory cell electrode;
   forming a layer to be used for said electrode for said first gate region, said layer being selectively placed over said second insulating layer in a manner such that said layer for said first gate electrode is located above both said first gate region and at least above a part of said memory cell region adjoining gate region;
   selectively removing said second insulating region so as to expose a part of said substrate, and;
   introducing an impurity of said opposite conductivity type so as to form said diffused layer, which forms one member of said diode region.

2. A process according to claim 1, wherein the materials for said memory cell electrode and said gate electrode are polycrystalline silicon, and said process includes an additional step of introducing an impurity into each of said layers of polycrystalline silicon.

3. A process according to claim 2, wherein said material for said memory cell electrode is polycrystalline silicon, and said first insulating layer is selected from the group consisting of $SiO_2$ and $Si_3N_4$, and said step of removing the first insulating layer includes a step of etching said exposed part by an etchant capable of dissolving said first insulating layer but not the polycrystalline silicon.

4. A process according to claim 1, wherein a portion of said second insulating layer is exposed, by a window formed by selective placement of said gate electrode layer, over said diode region and said step of selectively removing said second insulating layer includes a step of etching said exposed portion of the second insulating layer by an etchant capable of dissolving said second insulating layer but not the gate electrode.

5. A process according to claim 4, wherein said material for said gate electrode is polycrystalline silicon, and said process includes an additional step of introducing an impurity in said polycrystalline silicon.

6. A process according to claim 5, wherein said step of introducing said impurity of the opposite conductivity type to form said diffused layer and said additional step are performed simultaneously.

7. A process according to claim 6, wherein said impurity is introduced by diffusion.

8. A process according to claim 6, wherein said impurity is introduced by ion-implantation.

9. A process according to claim 1, wherein said materials for said memory cell electrode and said gate electrode are polycrystalline silicon, and said step of forming said layer for said gate electrode is performed in a manner such that said layer exposes an unmasked part of said second insulating layer over said memory cell region, said process includes an additional step of etching said exposed second insulating layer by an etchant capable of dissolving the same but not the polycrystalline silicon, thereby exposing said memory cell electrode at unmasked part of the second insulating layer over said memory cell region, and exposing said substrate at said diode region, and said step of introducing an impurity of the opposite conductivity type includes introducing the impurity into the exposed polycrystalline silicon electrodes for said memory cell and gate, and said exposed substrate.

10. A process according to claim 1, wherein said semiconductor memory device further comprises at least one MOS transistor having a source region, a second gate region and a drain region formed on another portion said substrate, said step of removing the exposed, other part of said first insulating layer is performed so as to also expose a part of the substrate and the first insulating layer over said other portion of said substrate, in which the MOS transistor is formed, so as to expose said other portion of said substrate;

said step of forming said second insulating layer is performed so as to also form said second insulating layer over the top surface of said other portion of the substrate, as well as said unmasked part of the substrate and said layer of material to be used for said memory cell electrode;

employing said second insulating layer as insulating layers of said first and second gate regions;

said step of forming a layer to be used for said electrode for first gate region is performed so as to form layers to be used for the electrodes of said first and second gate regions, one of said layers being selectively placed on said second insulating layer over said second gate region and the other of said layers being selectively placed over said second insulating layer in a manner such that said layer for said first gate electrode is located above said first gate region and at least a part of said memory cell region adjoining said first gate region;

said step of selectively removing said second insulating layer so as to expose said substrate is performed so as to expose said substrate at said source region and said drain region of said at least one MOS transistor as well as said diode region, and;

said step of introducing an impurity of said opposite conductivity type is performed so as to introduce said impurity into the exposed substrate so as to form said source, said drain and said member of said diode.

11. A process according to claim 10, wherein the materials for said memory cell electrode and said first and second gate electrodes are layers of polycrystalline silicon, and said process includes an additional step of introducing an impurity into each of said polycrystalline silicon layers.

12. A process according to claim 11, wherein said material for said memory cell electrode is polycrystalline silicon, and said first insulating layer is selected from the group consisting of $SiO_2$ and $Si_3N_4$, and said step of removing said first insulating layer includes a step of etching said exposed part by an etchant capable of dissolving said first insulating layer but not the polycrystalline silicon.

13. A process according to claim 12, wherein portions of said second insulating layer are exposed, by windows formed by selective placement of of said first and second gate electrode layers, one of said exposed portions is located over said diode region, and said step of selectively removing said second insulating layer comprises a step of etching said exposed portions of said second insulating layer by an etchant capable of dissolving said second insulating layer but not said gate electrodes.

14. A process according to claim 13, wherein said material for said first and second gate electrodes is polycrystalline silicon, and includes an additional step of introducing an impurity in said polycrystalline silicon.

15. A process according to claim 14, wherein said step of introducing said impurity of the opposite conductivity type to form said diffused layer and said additional step are performed simultaneously.

16. A process according to claim 12, wherein said materials for said memory cell electrode and said first and second gate electrodes are polycrystalline silicon, and said step of forming said layer for said gate electrodes is performed in a manner such that said layer exposes an unmasked part of said second insulating layer the over said memory cell region and said source and drain regions of said at least one MOS transistor, said process includes an additional step of etching said exposed second insulating layer by an etchant capable of dissolving the same but not the polycrystalline silicon, thereby exposing said memory cell electrode at the unmasked areas of the second insulating layer and exposing said substrate at said diode region, and said step of introducing an impurity of the opposite conductivity type includes introducing the impurity into all of the exposed polycrystalline silicon electrodes for said memory cell, said first and second gate electrodes, said source and drain regions of said substrate, and said diode of said substrate.

* * * * *

UNITED STATES PATENT AND TRADEMARK OFFICE
CERTIFICATE OF CORRECTION

PATENT NO. : 3,996,658

DATED : December 14, 1976

INVENTOR(S) Akira Takei et al

It is certified that error appears in the above-identified patent and that said Letters Patent are hereby corrected as shown below:

Column 1, line 50, after "gate" insert region.
Column 1, line 52, after "diode" insert -- formed by --.
Column 2, line 10, start a new paragraph beginning with the word --Since--.
Column 3, line 47, change "for dissolving" to --dissolve--.
Column 3, line 51, before "electrode" insert --gate--;
Column 3, line 51, after "the" (second occurrence) delete "gate".
Column 3, line 66, after "cell" insert --electrode--.

Column 10, claim 16, line 33, delete "the".

Signed and Sealed this

Nineteenth Day of April 1977

[SEAL]

Attest:

RUTH C. MASON
Attesting Officer

C. MARSHALL DANN
Commissioner of Patents and Trademarks

UNITED STATES PATENT AND TRADEMARK OFFICE
CERTIFICATE OF CORRECTION

PATENT NO. : 3,996,658
DATED : December 14, 1976
INVENTOR(S) : Akira Takei et al It is certified that error appears in the above-identified patent and that said Letters Patent are hereby corrected as shown below:

Column 3, line 66, change "said" to --the--.

Signed and Sealed this

Tenth Day of May 1977

[SEAL]

Attest:

RUTH C. MASON
Attesting Officer

C. MARSHALL DANN
Commissioner of Patents and Trademarks